(12) United States Patent
Shiozawa et al.

(10) Patent No.: US 10,863,282 B2
(45) Date of Patent: Dec. 8, 2020

(54) MEMS PACKAGE, MEMS MICROPHONE AND METHOD OF MANUFACTURING THE MEMS PACKAGE

(71) Applicant: SAE Magnetics (H.K.) Ltd., Hong Kong (HK)

(72) Inventors: Koichi Shiozawa, Hong Kong (HK); Masashi Shiraishi, Hong Kong (HK); Jumpei Tsuchiya, Hong Kong (HK); Lik Hang Ken Wan, Hong Kong (HK); Toyotaka Kobayashi, Hong Kong (HK); Hironobu Hayashi, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 52 days.

(21) Appl. No.: 16/262,908

(22) Filed: Jan. 30, 2019

(65) Prior Publication Data

US 2020/0245076 A1   Jul. 30, 2020

(51) Int. Cl.
| | |
|---|---|
| *H04R 19/04* | (2006.01) |
| *B81B 7/00* | (2006.01) |
| *B81C 1/00* | (2006.01) |
| *H04R 19/00* | (2006.01) |
| *H04R 1/04* | (2006.01) |
| *H04R 3/00* | (2006.01) |

(52) U.S. Cl.
CPC ........... *H04R 19/04* (2013.01); *B81B 7/0061* (2013.01); *B81C 1/00309* (2013.01); *H04R 1/04* (2013.01); *H04R 3/00* (2013.01); *H04R 19/005* (2013.01); *B81B 2207/012* (2013.01); *B81C 2203/0792* (2013.01); *H04R 2201/003* (2013.01)

(58) Field of Classification Search
CPC ... B81B 7/0032; B81B 7/0061; B81B 3/0027; B81B 2201/0257
See application file for complete search history.

(56) References Cited

U.S. PATENT DOCUMENTS

| | | | |
|---|---|---|---|
| 2009/0001553 A1* | 1/2009 | Pahl | B81B 7/0064 257/704 |
| 2013/0140656 A1* | 6/2013 | Pahl | H04R 29/004 257/416 |

FOREIGN PATENT DOCUMENTS

| | | |
|---|---|---|
| JP | 2011049752 A | 3/2011 |
| JP | 2012114672 A | 6/2012 |
| JP | 2015012605 A | 1/2015 |
| JP | 2015523836 A | 8/2015 |
| JP | 2015530790 A | 10/2015 |
| JP | 2016072959 A | 5/2016 |
| JP | 2016523725 A | 8/2016 |
| JP | 2017522814 A | 8/2017 |

* cited by examiner

*Primary Examiner* — Robert G Bachner
*Assistant Examiner* — Molly K Reida

(57) ABSTRACT

A MEMS package has a MEMS chip, a package substrate which the MEMS chip is adhered, a chip-cover which wraps the MEMS chip, and a cover-supporting part which supports the chip-cover from the inside. In the MEMS package, the chip-cover is supported by the cover-supporting part to form a back chamber, surrounded by the chip-cover and the package substrate.

12 Claims, 21 Drawing Sheets

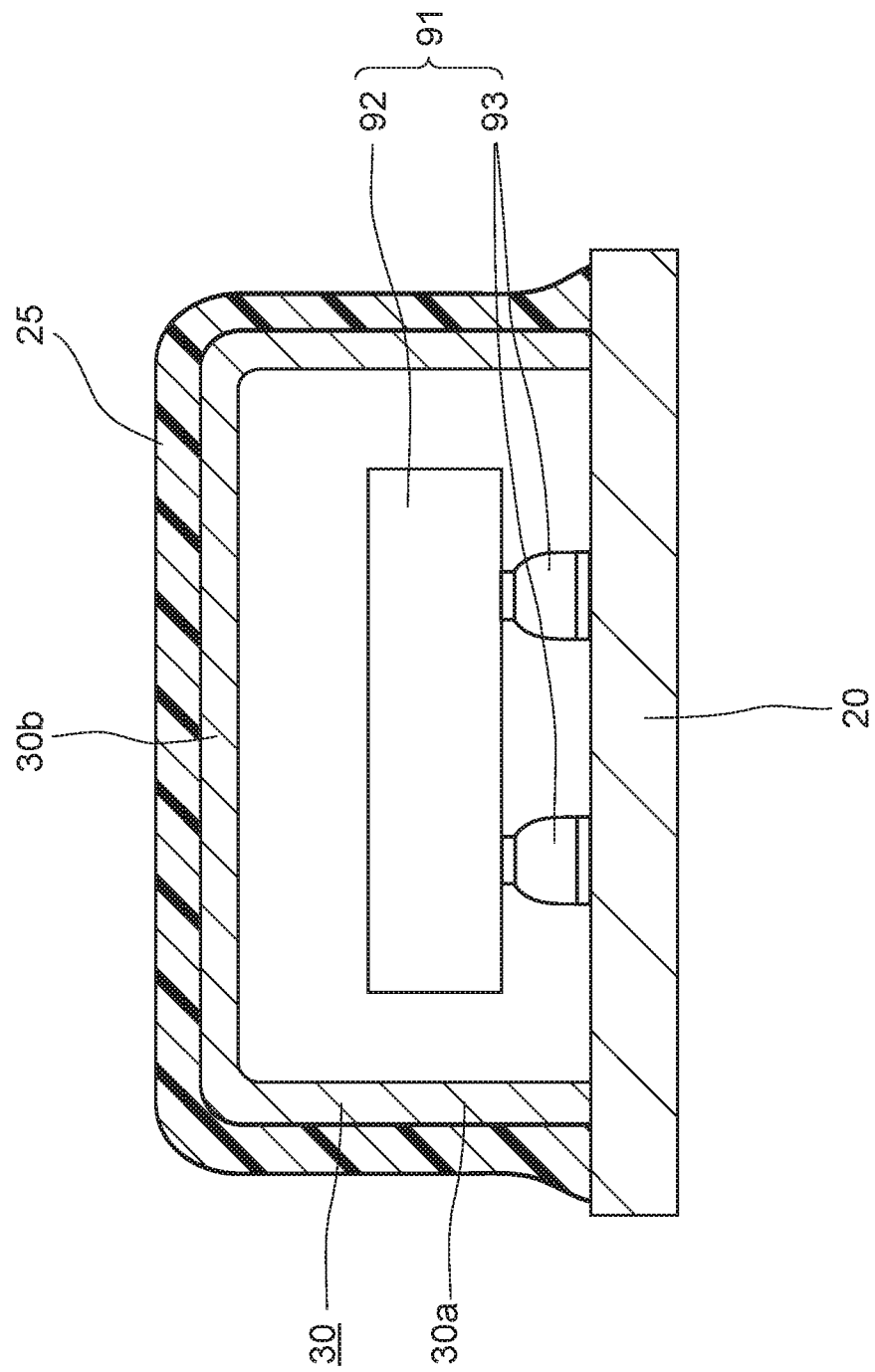

MEMS PACKAGE, MEMS MICROPHONE AND METHOD OF MANUFACTURING THE MEMS PACKAGE

BACKGROUND

Field of the Invention

The present invention relates to a MEMS package which a MEMS chip, being used as a microphone, a sensor and so on, is mounted on a package substrate, a MEMS microphone having the MEMS package and method of manufacturing the MEMS package.

Related Background Art

A minute device, which is called MEMS (Micro Electro Mechanical Systems), is conventionally known. The MEMS is a device which a minute movable element and an electronic circuit are integrated on a substrate (which is also called element substrate) made of silicon and so on. Because the whole of MEMS is formed in a chip-like form, the MEMS is also called a MEMS chip, in the present invention. The MEMS chip is used as a microphone, sensor, actuator and so on.

For example, the MEMS chip, which is used as the microphone, has a membrane being a thin-film and electrodes made of one or two thin-film arranged in the neighborhood of the membrane, and the MEMS chip has a structure which a concave part, for arranging the membrane, is formed. In case of the MEMS chip, which is used as the microphone of capacitance-type, displacement of the membrane, in accordance with sound pressure, is detected as displacement of capacitance between the electrodes. Therefore, the MEMS chip, which is used as the microphone of capacitance-type, operates with the principle of a variable capacitor.

Then, concerning the MEMS package which the MEMS chip is mounted on the package substrate, the following two structures are conventionally known. The one is a structure which the MEMS chip is mounted on the package substrate by a FCB (Flip Chip Bonding, for example see JP2016-523725 (also called patent document 1)), and the other is a structure which the MEMS chip is mounted on the package substrate by a Wire Bonding (for example, see JP2012-114672 (also called patent document 2)).

SUMMARY OF THE INVENTION

By the way, in case of the MEMS package which is used as the microphone, it is important that the sound, entered from outside, reaches the membrane. As the structure for the—above, the structure, which sound holes are formed on both the package substrate and motherboard (also called a bottom-port structure), is conventionally known (for example, see JP2017-522814 (also called patent document 3)).

However, in case of the bottom-port structure, it is necessary that sound holes are formed on both the package substrate and motherboard. Then, because a space of the motherboard, which the MEMS package is mounted, is limited, generality about a mounting space is low, concerning the bottom-port structure.

On the other hand, the structure, which the sound hole is formed in a cap (also called a lid-part, a case, a housing) for accommodating the MEMS package (also called a top-port structure) is conventionally known (for example, see JP2015-530790 (also called patent document 4), JP2016-72959 (also called patent document 5), JP2015-12605 (also called patent document 6)).

Then, there are respectively the following problems concerning the MEMS packages disclosed in the patent document 4 to patent document 6.

In case of the MEMS package 290 disclosed in the patent document 4, as illustrated in FIG. 18, the MEMS chip 291 is fixed on the cap 292 which the sound hole 292b is formed. An ASIC 293 is also fixed on the cap 292.

However, in case of the MEMS package 290, a conductive layer 295, connecting the MEMS chip 291 and a bottom part 294, a conductive layer 296, connecting the ASIC 293 and the bottom part 294, are formed in an inside-space 297. Then in case of the MEMS package 290, the conductive layers 295, 296 are formed along with the up and down direction in the inside-space 297. Therefore, the structure of the MEMS package 290 is complicated, it is difficult to manufacture the MEMS package 290. Further, because a space of the sound hole 292b is limited, generality about a forming space of the sound hole is low, concerning the MEMS package 290.

Further, in case of the MEMS package 310 disclosed in the patent document 5, as illustrated in FIG. 19, the MEMS chip 300 is fixed on the cap 301 which the sound hole 301b is formed, and the ASIC 303 is fixed on the package substrate 302.

In case of the MEMS package 310, a conductive member 305 connected to the cap 301 and the package substrate 302 are arranged inside the cap 301. Further, a metal wire 306 is connected to a connecting pad 304 of the conductive member 305, the MEMS chip 300 is connected with the ASIC 303 via the metal wire 306.

Then, in case of the MEMS package 310, it is necessary for the metal wire 306 and the conductive member 305 to be formed, before the package substrate 302 is covered with the cap 301. Therefore, the structure of the MEMS package 310 is complicated, and it is difficult that the MEMS package 310 is surely manufactured.

Further, in case of the MEMS package 410 disclosed in the patent document 6, as illustrated in FIG. 20, an inner cap 402 is arranged inside an outer cap 401, which the sound hole 401b is formed. The MEMS chip 403 and the ASIC 404 are fixed on the package substrate 405 inside the inner cap 402. A sound channel 405a is formed in the package substrate 405. Then, sound 406 reach the MEMS chip 403 passing through the sound hole 401b, the sound channel 405a, as indicated by the arrow in FIG. 20.

In this case, sound 406 enters inside the outer cap 401 from the sound hole 401b, and after bending, it reaches the MEMS chip 403. Then, because sound 406 is decreased largely before it reaches the MEMS chip 403, sensitivity of the MEMS package 410 is decreased.

On the other hand, the MEMS package, which a seal-part for connecting the sound hole to the MEMS chip, is conventionally known (for example, see JP2011-49752 (also called patent document 7), JP2015-523836 (also called patent document 8)). For example, as illustrated in FIG. 21, the MEMS package 510, which has the cap 501 having the sound hole 501b, the MEMS chip 502, the ASIC 503, and the package substrate 504, is known. In the MEMS package 510, the seal-part 505 is formed inside the cap 501 so that part, from the sound hole 501b to the MEMS chip 502, is sealed.

Then, in the MEMS package 510, because the seal part 505 is needed to be fixed on the MEMS chip 502, the position of the sound hole 501b on the cap 501 is fixed in relations with the MEMS chip 502. Therefore, generality about the MEMS package 510 is low. Further, it is necessary for the seal-part 505 to be formed, before the package substrate 504 is covered with cap 501.

Therefore, it is extremely difficult that the MEMS package 510 is surely manufactured.

As described-above, there are problems, generality is low because of limitation about the position of the sound hole, a certain manufacturing of the MEMS package is difficult because of the complicated structure, and sensitivity is low, in the conventional MEMS package having the top-port structure.

Hence the present invention is made to solve the above problem, and it is an object to provide the MEMS package, the MEMS microphone and method of manufacturing the MEMS package, having high generality of the position of the sound hole, which sensitivity does not decrease, and which can be manufactured certainly.

To solve the above problem, the present invention is a MEMS package including: a MEMS chip, a package substrate which the MEMS chip is adhered, a chip-cover which wraps the MEMS chip and a cover-supporting part which supports the chip-cover from the inside; the chip-cover is adhered to the package substrate, the cover-supporting part is adhered to the package substrate, the chip-cover is supported by the cover-supporting part to form a back chamber, surrounded by the chip-cover and the package substrate.

In case of the above-described MEMS package, it is possible that the MEMS package further including: an ASIC package which is adhered to the package substrate in the back chamber.

Further, in case of the above-described MEMS package, it is preferable that the MEMS chip includes an element substrate which a movable element is formed, the element substrate includes a hole-part which the movable element is arranged, the chip-cover includes a cover-hole-part formed in accordance with the hole-part.

Furthermore, in case of the above-described MEMS package, it is preferable that the cover-supporting part includes an open-covered-structure which includes a wall-like side-part and a lid-part, the wall-like side-part extends along with a surface intersecting direction of the package substrate, and the MEMS chip side is opened, the lid-part is formed in an upper end part of the wall-like side-part, the ASIC package is arranged under the lid-part.

Further, it is preferable that the MEMS chip is mounted on the package substrate by a FCB, the chip-cover is formed so as to be in contact with a chip-surface, being the outer surface, and the side surface of the MEMS chip.

Further, the present invention provides a MEMS microphone including: a MEMS package, and a cap which wraps the MEMS package, the MEMS package includes a MEMS chip, a package substrate which the MEMS chip is adhered, a chip-cover which wraps the MEMS chip and a cover-supporting part which supports the chip-cover from the inside; the chip-cover is adhered to the package substrate, the cover-supporting part is adhered to the package substrate, the chip-cover is supported by the cover-supporting part to form a back chamber, surrounded by the chip-cover and the package substrate.

In case of the above-described MEMS microphone, it is preferable that the cap includes a top-surface, which is formed so as to oppose to the package substrate, and a cap-side-surface, which surrounds the top-surface and adhered to the package substrate, the MEMS microphone further including a front chamber which is formed between the top-surface, the cap-side-surface and the chip-cover.

Further, it is preferable that the MEMS chip includes an element substrate which a movable element is formed, the element substrate includes a hole-part which the movable element is arranged, the chip-cover includes a cover-hole-part formed in accordance with the hole-part.

Furthermore, it is possible that the top-surface includes a top-hole which is formed in the position in accordance with the cover-hole-part.

Further, it is possible that the cap-side-surface includes a side-hole which is formed in the position in accordance with the side surface of the MEMS chip.

Further, it is possible that the MEMS microphone, further including: an ASIC package which is adhered to the package substrate in the back chamber.

Further, the present invention provides a method of manufacturing a MEMS package, using a MEMS chip, an ASIC and a package substrate including: a mounting step for mounting the MEMS chip and the ASIC, by a FCB, on each of package regions of a package-panel which the plural package regions, for manufacturing the package substrate, are formed; a cover-supporting part adhering step for adhering a cover-supporting part includes an open-covered-structure being constituted by a wall-like side-part, partially opened, and a lid-part, being formed in an upper end part of the wall-like side-part so that the ASIC is covered with the lid-part, an opened end-part of the wall-like side-part is adjacent to the MEMS chip; a chip-cover forming step for forming a chip-cover which wraps the MEMS chip and the cover-supporting part with a heat-resistant adhesive sheet, being applied on the surface of the package-panel, by performing vacuum lamination; and a removing step for removing the unnecessary parts of the heat-resistant adhesive sheet, on the package-panel.

Furthermore, it is preferable that the MEMS chip includes an element substrate which a movable element is formed, the element substrate includes a hole-part which the movable element is arranged, the removing step is performed so that the part of the chip-cover, corresponding to the hole-part, is removed to form a cover-hole-part.

Further, it is possible that the chip-cover forming step is performed so that the package-panel is heated to harden the heat-resistant adhesive sheet.

Further, it is also possible that the method of manufacturing a MEMS package, further including: a cover-supporting part manufacturing step for manufacturing the cover-supporting part by press bending procedure of metal plate.

The present invention will be more fully understood from the detailed description given hereinbelow and the accompanying drawings which are given by way of illustration only, and thus are not to be considered as limiting the present invention.

BRIEF DESCRIPTION OF THE DRAWINGS

FIG. 4 is a sectional view of a part corresponding to the line 4-4 in FIG. 2;

DETAILED DESCRIPTION OF THE EMBODIMENTS

In the following, embodiments of the present invention will be described with reference to the drawings. Note that the same components will be referred to with the same numerals or letters, while omitting their overlapping descriptions.

(Structure of the MEMS Package, MEMS Microphone)

To begin with, the structure of the MEMS package 1, MEMS microphone 100, according to the embodiment of the present invention will be explained with reference to FIG. 1 to FIG. 6.

Figure 1:
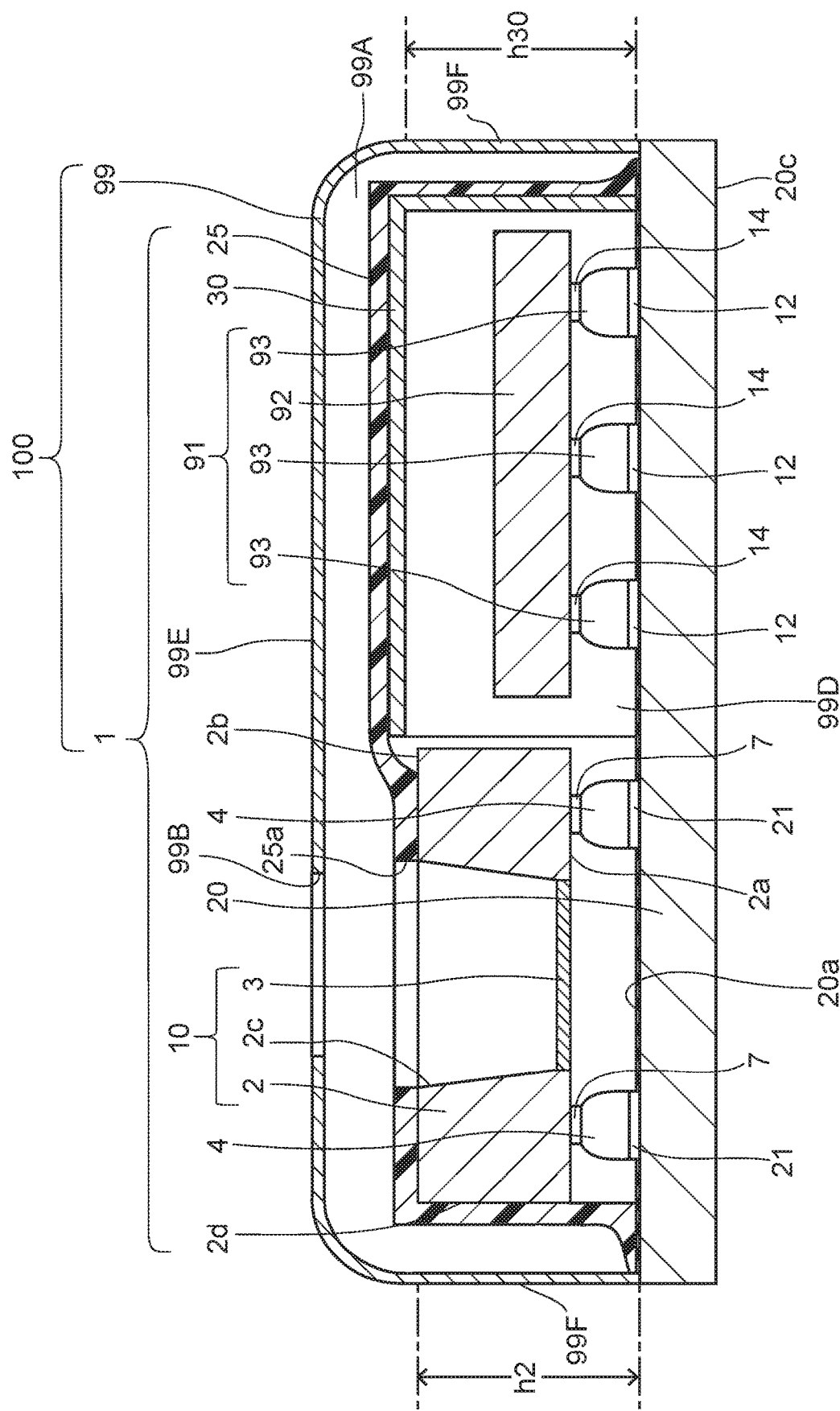
FIG. 1 is a sectional view, of a part corresponding to the line 1-1 in FIG. 2, showing the MEMS microphone having the MEMS package according to the embodiment of the present invention.
Figure 2:
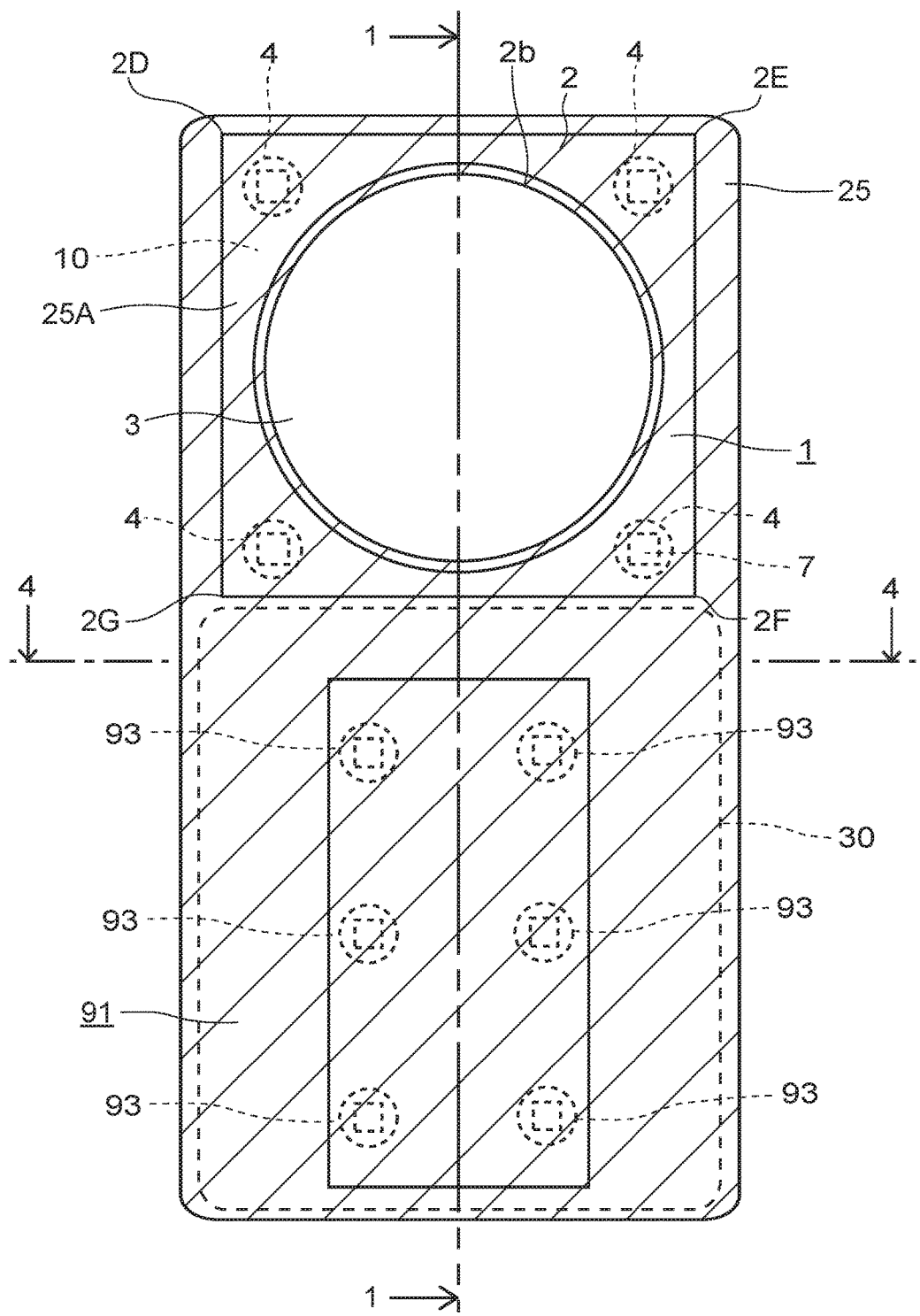
FIG. 2 is a plan view showing a principal part of the MEMS package.
Figure 3:
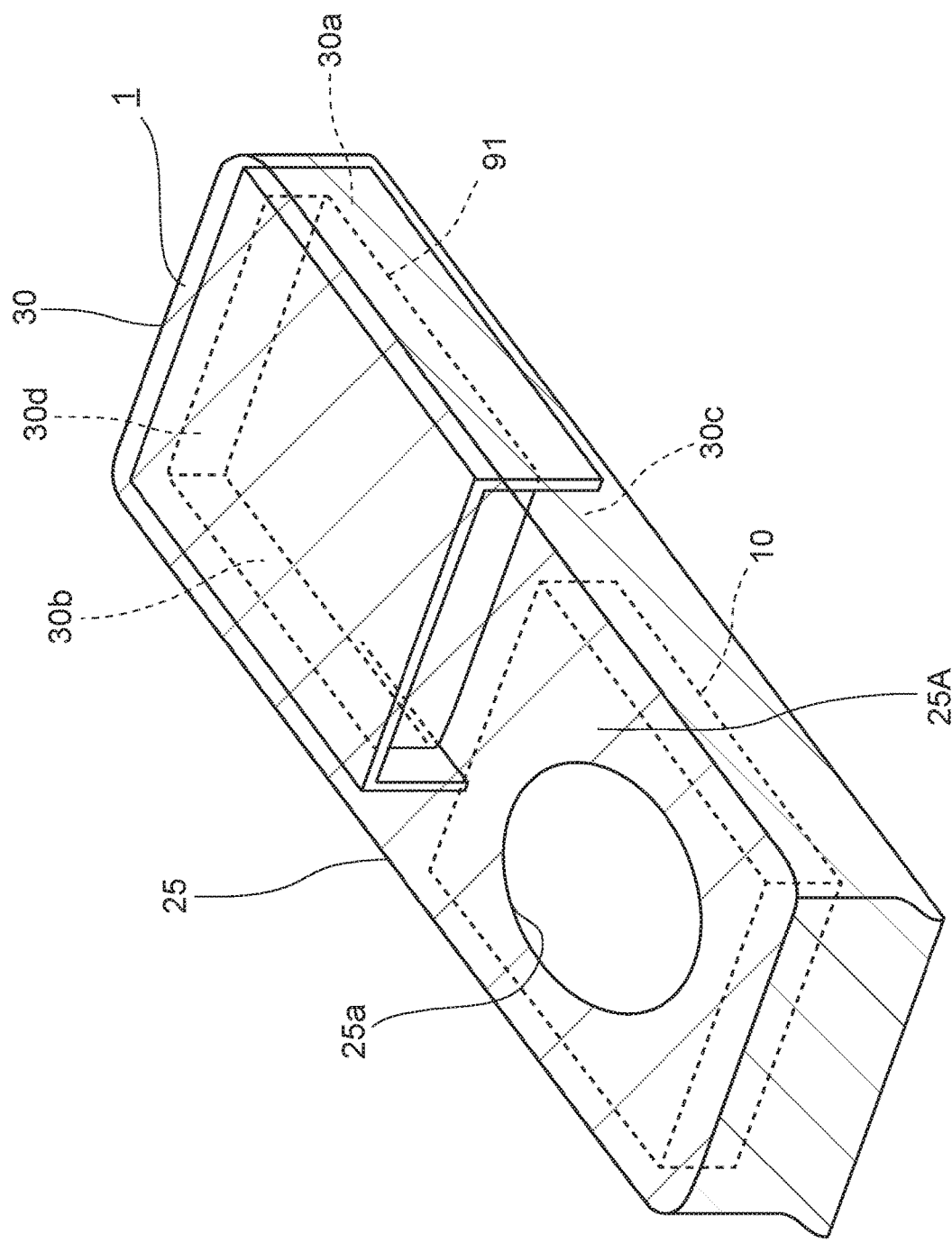
FIG. 3 is a perspective view showing the MEMS package.
Figure 5A:
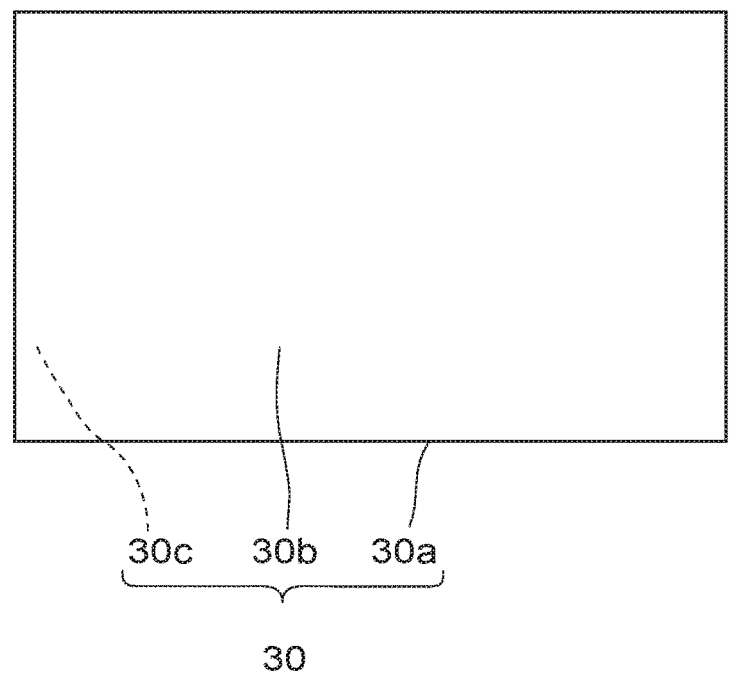
FIG. 5(a) is a plan view showing a cover-supporting part.
Figure 5B:
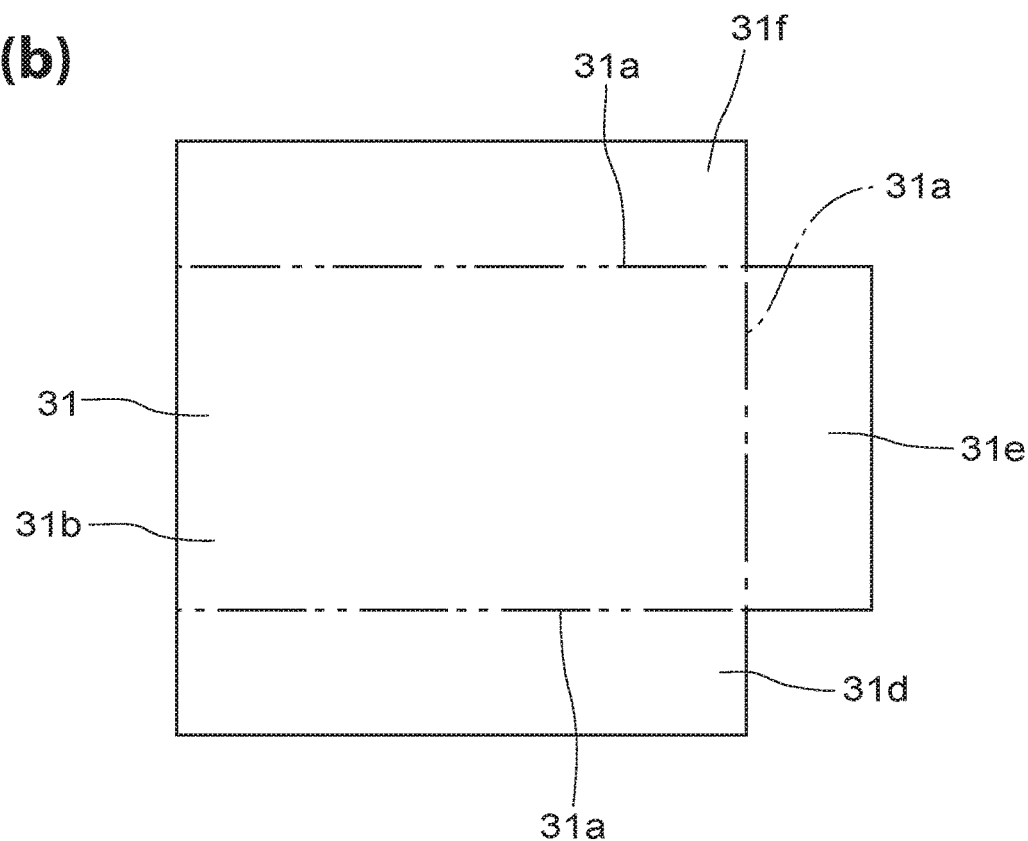
FIG. 5(b) is a plan view showing an expanded condition before bend-processing of a metal-pattern.
Figure 6:
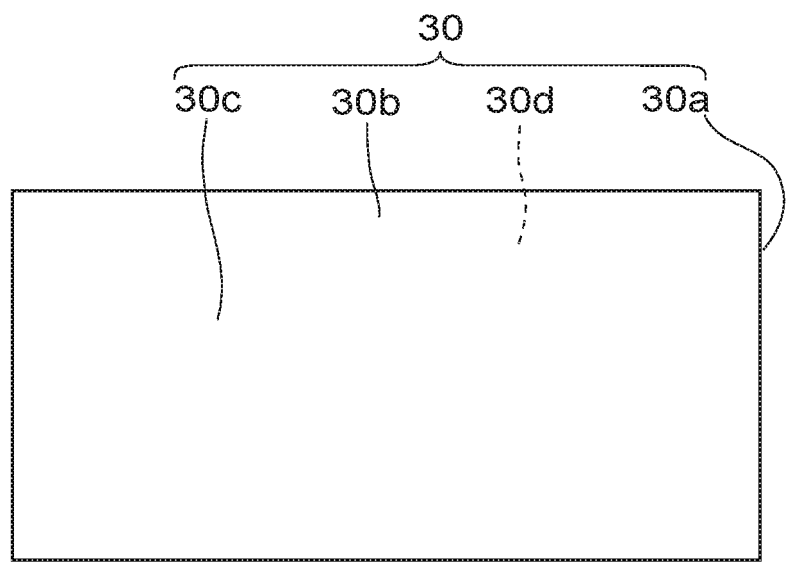
FIG. 6 is a front view showing the cover-supporting part, seen from an opened end-part side.

FIG. 1 is a sectional view, of a part corresponding to the line 1-1 in FIG. 2, showing the MEMS microphone 100 having the MEMS package 1 according to the embodiment of the present invention. FIG. 2 is a plan view showing a principal part of the MEMS package 1. FIG. 3 is a perspective view showing the MEMS package 1. FIG. 4 is a sectional view of a part corresponding to the line 4-4 in FIG. 2. FIG. 5 (a) is a plan view showing the cover-supporting part 30. FIG. 6 is a front view showing the cover-supporting part 30, seen from the opened end-part side 30c side.

As illustrated in FIG. 1, the MEMS microphone 100 has the MEMS package 1, an ASIC (Application Specific Integrated Circuit) package 91 and the cap 99.

The MEMS package 1 has the MEMS chip 10, the package substrate 20, which the MEMS chip 10 is adhered, bonding bumps 4, a chip-cover 25 and the cover-supporting part 30. The MEMS chip 10 and the ASIC 92 are mounted on the package substrate 20 by the FCB, in the MEMS package 1.

The MEMS chip 10 has an element substrate 2 which the membrane 3, as a movable element, is formed. The MEMS chip 10 is used as the microphone of capacitance-type. The element substrate 2 is a substrate formed in a rectangular-shape in a plan view, as illustrated in FIG. 2, and it is formed with silicon. A hole-part 2c is formed in the center of the element substrate 2. The hole-part 2c is formed in a cylindrical-shape from a chip-surface 2b (outside surface of the element substrate 2) of the element substrate 2 to an opposing surface 2a (the surface of the element substrate 2, opposing to the package substrate 20), and the membrane 3 is arranged in the opposing surface 2a side of the hole-part 2c. Note that two thin-films, which are called back-plates (not illustrated), are arranged in the upper side and the lower side of the membrane 3.

As illustrated in FIG. 1, the bonding bumps 4 are solder bumps adhered to both the opposing surface 2a and the package substrate 20.

The membrane 3 is vibration film formed approximately in a circular-shape, and it is a thin-film made of an inorganic metal such as $SiO_2$, SiN or the like.

The bonding bumps 4 are solder bumps made of solder. As illustrated in FIG. 1, the bonding bumps 4 are adhered to both the MEMS chip 10 and the package substrate 20. Namely, the bonding bumps 4 are adhered respectively to electrode pads 7, formed in the opposing surface 2a, and electrode pads 21 formed in a package surface 20a (surface of the MEMS chip 10 side of the package substrate 20) of the package substrate 20.

The four bonding bumps 4 connect the MEMS chip 10 electrically and fixedly to the package substrate 20.

The chip-cover 25 is supported by the cover-supporting part 30 and wraps the MEMS chip 10. The chip-cover 25 is a thin-film like member, and it is in contact with closely the MEMS chip 10 (a side surface 2d, a chip-surface 2b) and the whole surface of the cover-supporting part 30 (a later-described wall-like side-part 30a and a lid-part 30b), and it is formed so as to wrap them. Further, the peripheral part of the chip-cover 25 is adhered to the package substrate 20. For example, the chip-cover 25 is formed using high heat-resistant adhesive sheet with epoxy resin.

Then, as illustrated in FIG. 1 in detail, a first closed-space, surrounded by the chip-cover 25 and the package substrate 20, is formed in the MEMS package 1. The first closed-space is a space which arranged inside more than the cover-supporting part 30. Further, because the first closed-space is arranged rear side of the membrane 3, it corresponds to a back chamber 99D. The ASIC package 91 is arranged inside the back chamber 99D.

The chip-cover 25 has a cover-hole-part 25a. The cover-hole-part 25a is formed in about the center of a chip-corresponding part 25A. The chip-corresponding part 25A is a part, of the chip-cover 25, arranged on the upper side of the MEMS chip 10 (on the chip-surface 2b of the element substrate 2). The cover-hole-part 25a is formed in a circular shape in accordance with the hole-part 2c. The cover-hole-part 25a is formed in a position in accordance with the hole-part 2c. Further, both centers are overlapped, they have the same diameter, the cover-hole-part 25a is formed so as to communicate with the hole-part 2c.

The cover-supporting part 30 is adhered to the package substrate 20. The cover-supporting part 30, as illustrated in FIG. 1, FIG. 4 in detail, is in contact with the inside of the chip-cover 25, and supports the chip-cover 25 from the inside. The chip-cover 25 is supported by the cover-supporting part 30 to form the back chamber 99D.

Then the cover-supporting part 30 has, as illustrated in FIG. 3 to FIG. 6, the wall-like side-part 30a and the lid-part 30b, and it has the structure which the MEMS chip 10 side of the wall-like side-part 30a is opened (the structure of the cover-supporting part 30 is also called open-covered-structure).

The wall-like side-part 30a is a wall like member which extends from the package surface 20a of the package substrate 20 along with the intersecting direction of the package surface 20a. The wall-like side-part 30a is formed U-shaped with all corners in approximate right angles, or it is formed square bracket like shape, surrounding the ASIC package 91 from three directions. The MEMS chip 10 side of the wall-like side-part 30a is opened. The end part of the opened side is the opened end-part 30c. As illustrated in FIG. 3, FIG. 6, the opened end-part 30c is entirely opened. Further, the part, of the wall-like side-part 30a, opposing to the opened end-part 30c is a rear-surface part 30d. The rear-surface part 30d is entirely closed.

The lid-part 30b is formed on the upper end part of the wall-like side-part 30a. The lid-part 30b is formed in a board-like shape having rectangular shape in a plan view, as illustrated in FIG. 5(a). The approximate closed-space is secured inside of the cover-supporting part 30, by the lid-part 30b and the wall-like side-part 30a. The ASIC package 91 is arranged under the lid-part 30b.

Then as illustrated in FIG. 1, the cover-supporting part 30 is formed so that the interval from the package substrate 20 becomes a supporting-height h30. Further, the interval between the chip-surface 2b of the MEMS chip 10 (element substrate 2) and the package substrate 20 is a chip-height h2.

Further, the cover-supporting part 30 is arranged entirely outside the MEMS chip 10 (element substrate 2). The cover-supporting part 30 is arranged so that the opened end-part 30c is adjacent to the MEMS chip 10.

The ASIC package 91 has the ASIC 92, the package substrate 20 which the ASIC 92 is adhered, and the bonding bumps 93. The ASIC 92, for example, is an integral circuit which amplifies an output signal of the MEMS chip 10 (an integral circuit which outputs displacement of a capacitance as displacement of the voltage in the MEMS chip 10). Electrode pads 14 are formed lower side of the ASIC 92. The electrode pads 14 are connected to the electrode pads 12 of the package surface 20a by the bonding bumps 93.

The package substrate 20 is a board like member made of such as silicon, ceramic or the like (or PCB: Printed Circuit Board). The electrode pads 21 and electrode pads 12 are formed on the package surface 20a of the package substrate 20. The MEMS package 1 is mounted on the part, of the package surface 20a, which the electrode pads 21 are formed, the ASIC package 91 is mounted on the part which the electrode pads 12 are formed.

The cap 99 covers the MEMS package 1 and the ASIC package 91. The cap 99 is adhered to the package surface 20a with not illustrated adhesive (or by soldering).

There is an inner-volume inside of the cap 99, and the MEMS package 1 and the ASIC package 91 are accommodated in the inner-volume.

The cap 99 has a top-surface 99E and a cap-side-surface 99F. The top-surface 99E is a part which is formed so as to oppose to the package substrate 20. The cap-side-surface 99F is a part which is formed on the peripheral part of the top-surface 99E. The cap-side-surface 99F surrounds the top-surface 99E, and it is adhered to the package substrate 20.

In the MEMS microphone 100, a top-hole 99B is formed in the top-surface 99E. The top-hole 99B is a hole-part having a circular shape, and it is arranged in the position in accordance with the cover-hole-part 25a.

Then, in the MEMS microphone 100, the second closed-space, which is surround by the top-surface 99E, the cap-side-surface 99F of the cap 99 and the chip-cover 25, is formed. The second closed-space is a space which is arranged inside more than the cap 99, and outside more than the chip-cover 25. The second closed-space corresponds to a front chamber 99A, because it is arranged front side than the membrane 3.

(Method of Manufacturing the MEMS Package, MEMS Microphone)

Figure 12:
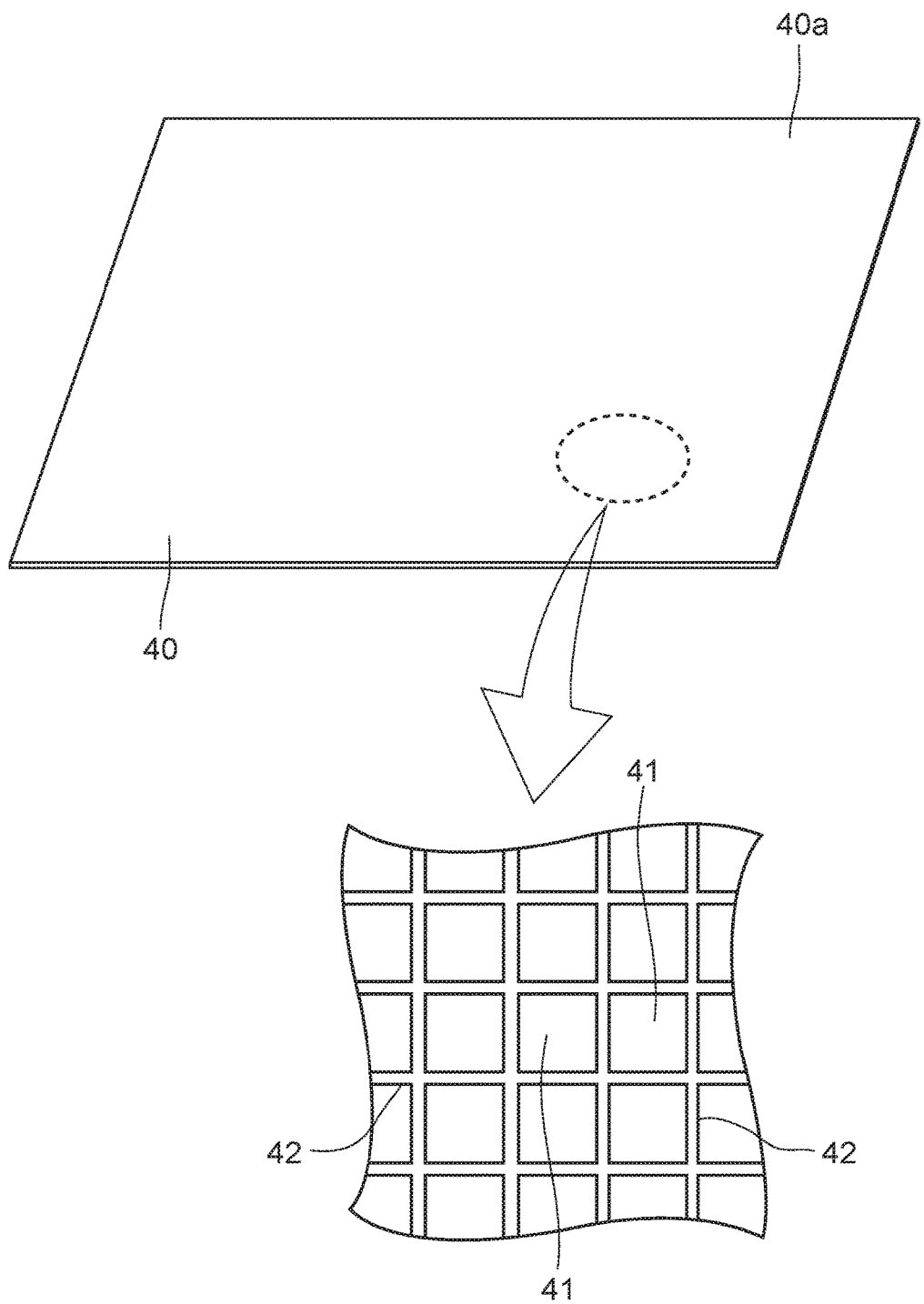
FIG. 12 is a perspective view showing a package-panel, used for manufacturing the MEMS package and the MEMS microphone, according to the embodiment of the present invention.
Figure 13:
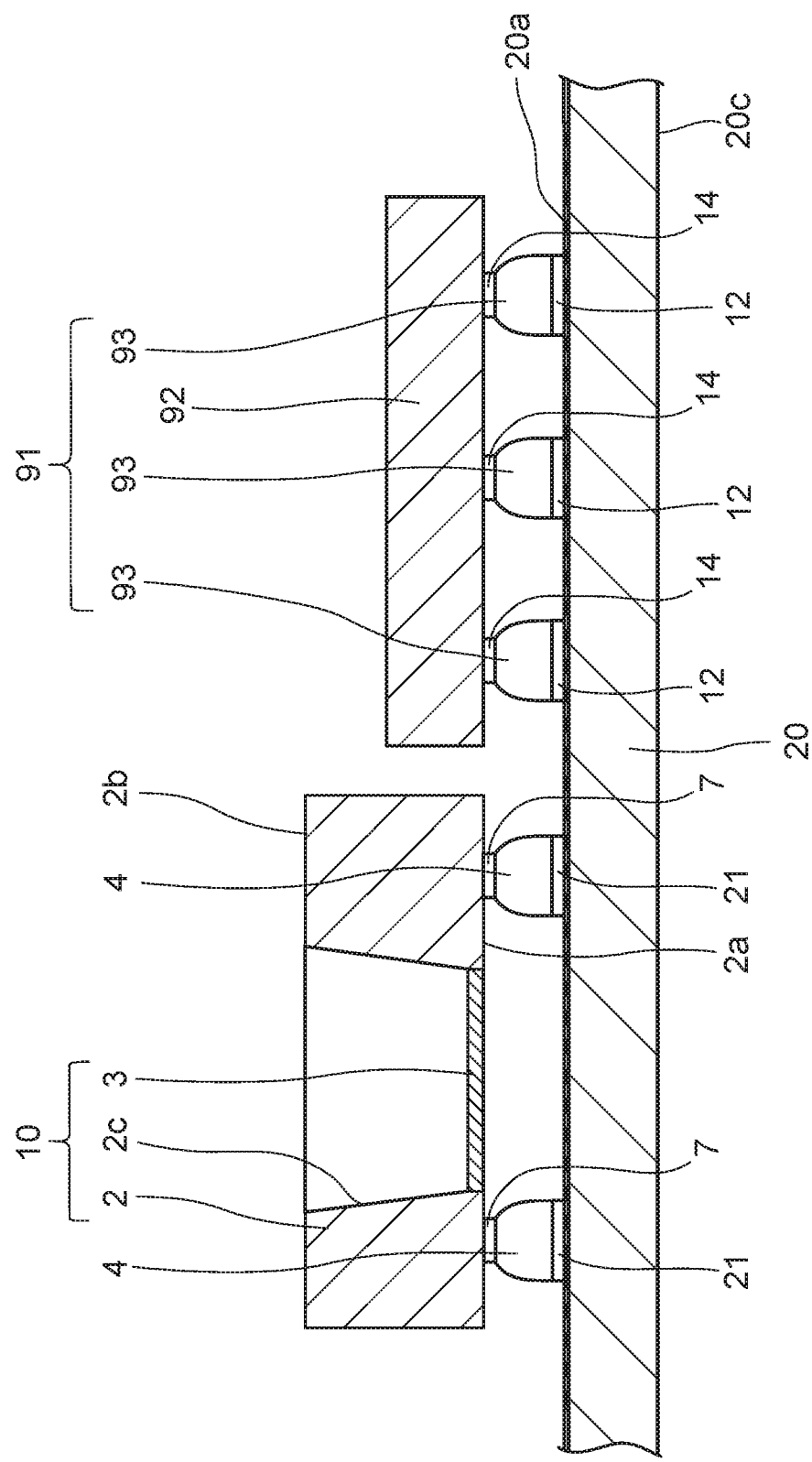
FIG. 13 is a sectional view showing a manufacturing step of the MEMS package according to the embodiment of the present invention, corresponding to FIG. 1.
Figure 14:
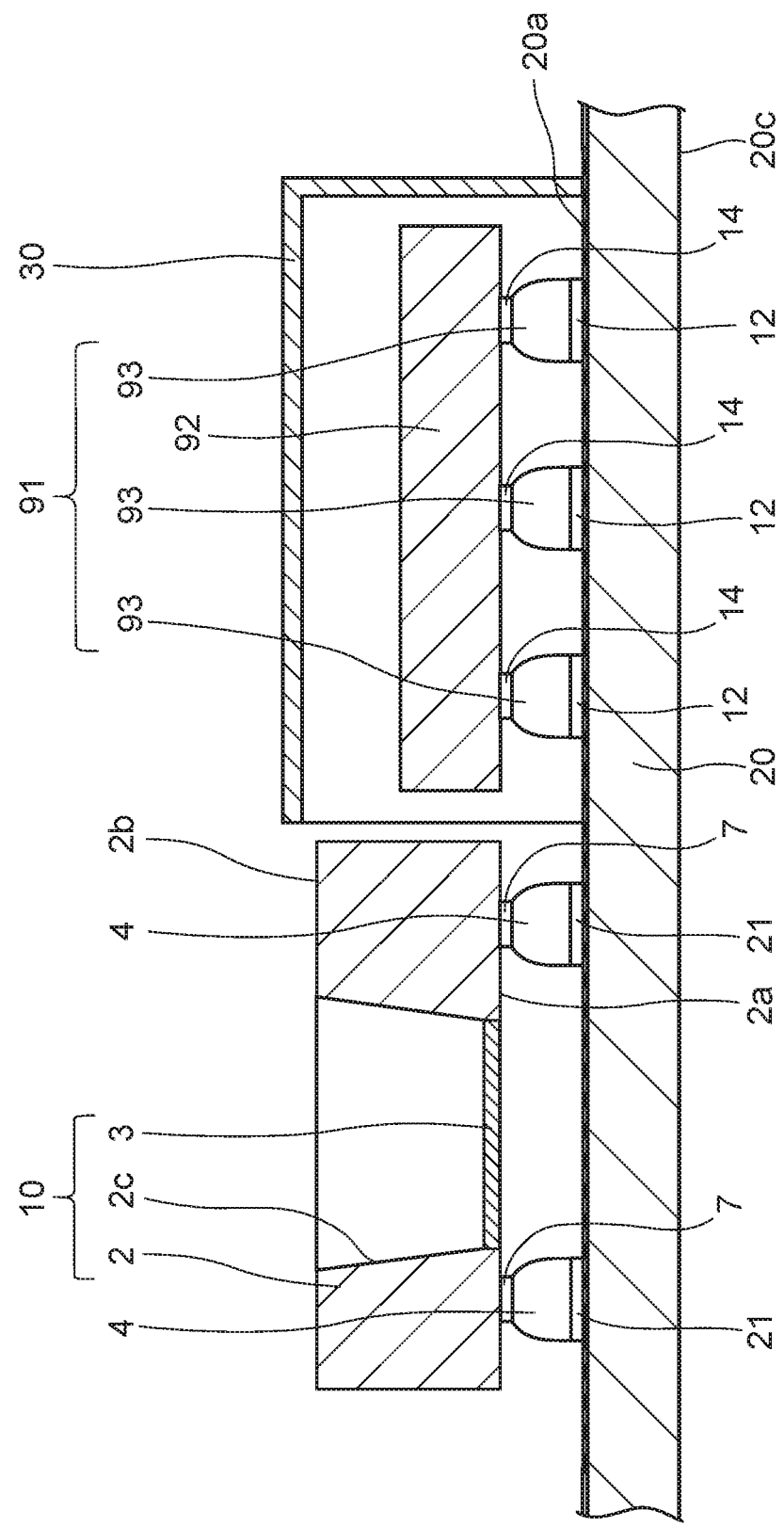
FIG. 14 is a sectional view showing the manufacturing step subsequent to that in FIG. 13.
Figure 15:
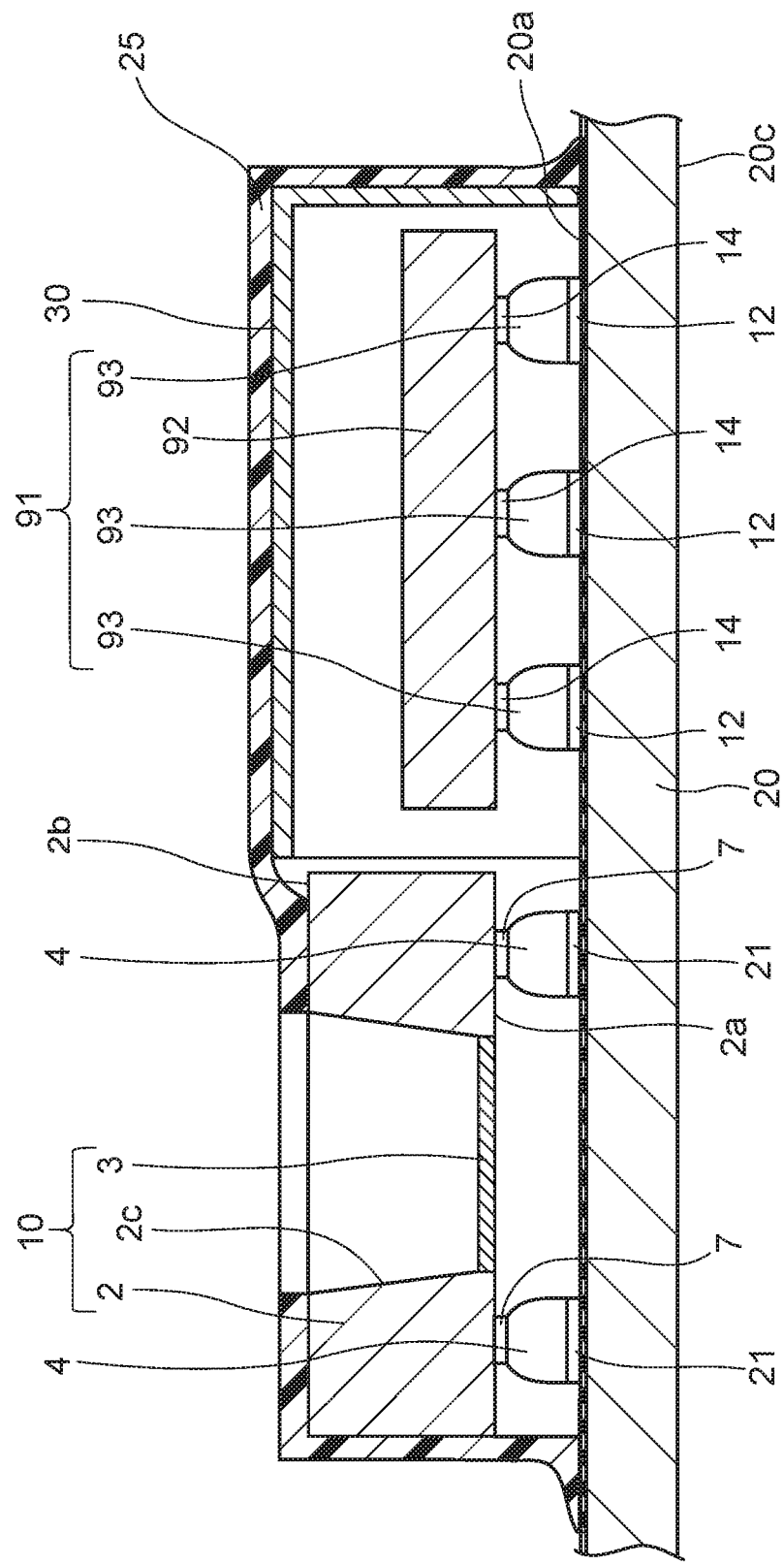
FIG. 15 is a sectional view showing the manufacturing step subsequent to that in FIG. 14.

Subsequently, the method of manufacturing the MEMS package 1 and the MEMS microphone 100, having the above structure, will be explained with reference to FIG. 12 to FIG. 15. Here, FIG. 12 is a perspective view showing the later-described package-panel 40, FIG. 13 to FIG. 15 are sectional views showing the manufacturing step of MEMS package 1.

In the Method of manufacturing the MEMS package 1, the MEMS package 1 is manufactured using the above-mentioned MEMS chip 10, the ASIC 92 and the package substrate 20. In case of the method of manufacturing according to the embodiment, the MEMS chip 10 (rectangular MEMS chip), having the rectangular element substrate 2, is used. Further, the package-panel 40, illustrated in FIG. 12, is used.

The package-panel 40 is a board-like member, having rectangular shape, made of PCB or ceramic, and plural package-regions 41 are formed on the surface 40a by a uniform arrangement. When the package-panel 40 is divided along with divided lines 42, the package substrate 20 is manufactured from each package region 41 (about 600 package substrates 20 are manufactured by every package-panel 40).

A mounting step, a cover-supporting part manufacturing step, a cover-supporting part adhering step, a chip-cover forming step and a removing step are included in the method of manufacturing the MEMS package 1.

In the mounting step, the MEMS chip 10 and the ASIC 92 are mounted in each of the package regions 41 of the package-panel 40. In this case, in the MEMS chip 10, the four bonding bumps 4 are formed in the opposing surface 2a side. In the ASIC 92, bonding bumps 93 are formed. After that, as illustrated in FIG. 13, the MEMS chip 10 and the ASIC 92 is mounted respectively on each of the package regions 41 by the FCB.

Next, the cover-supporting part adhering step is performed. In the cover-supporting part adhering step, the above-described cover-supporting part 30 is adhered to each of the package regions 41.

In the embodiment, the cover-supporting part manufacturing step is performed as follows, before performing the cover-supporting part adhering step. The cover-supporting part 30 is manufactured by performing the cover-supporting part manufacturing step.

In the cover-supporting part manufacturing step, a thin-metal plate (for example, a metal plate having thickness about 50 μm with SUS or phosphor bronze, in case of phosphor bronze, preferably Ni plating is applied) is used. Then, the metal plate is cut using the NC apparatus to form a metal-pattern 31 having the predetermined size. Bending procedure, with press apparatus, is performed to the metal-pattern 31 to form the cover-supporting part 30. As illustrated in FIG. 5(b), the metal-pattern 31 has bend-lines 31a, a main body part 31b, three extending parts 31d, 31e, 31f. Then, when the three extending parts 31d, 31e, 31f are bend via the bend-lines 31a so as to form approximate right angle, the cover-supporting part 30 is manufactured.

Then, the cover-supporting part 30, which is manufactured as described-above, is adhered on each of the package regions 41 with adhesive. At this time, as illustrated in FIG. 14, the cover-supporting part 30 is adhered so that the ASIC 92 is covered with the lid-part 30b, and the opened end-part 30c is adjacent to the MEMS chip 10.

Next, the chip-cover forming step is performed. In the chip-cover forming step, a vacuum lamination is performed using a not-illustrated vacuum laminator. Then, the surface 40a of the package-panel 40 is covered with the high heat-resistant adhesive sheet with epoxy resin (not-illustrated). In this case, the MEMS chip 10 is mounted on each of the package regions 41 of the package-panel 40, the cover-supporting part 30 is adhered so as to be adjacent to the MEMS chip 10. Therefore, the high heat-resistant adhesive sheet is adhered to the surface of each of the MEMS chips 10 (chip-surface 2b, side surface 2d), and the surface of the cover-supporting part 30 without gap. Further, the package-panel 40 is heated to harden the high heat-resistant adhesive sheet. Thereby, the chip-cover 25 is formed.

Subsequently, the removing step is performed. In the removing step, unnecessary parts of the high heat-resistant adhesive sheet are removed with laser. In this case, parts of the high heat-resistant adhesive sheet, arranged between each of the package regions 41 and corresponding to the hole-part 2c of the chip-cover 25, are removed. By the removing step, the cover-hole-part 25a is formed in the chip-cover 25.

More subsequently, each of the package regions 41 of the package-panel 40 is covered with the cap 99. In this case, the top-hole 99B is previously formed in the cap 99. Therefore, the cap 99 is applied to each of the package regions 41 so that the top-hole 99B is arranged in the position in accordance with the cover-hole-part 25a.

After that, a panel cutting step is performed. In the panel cutting step, the package-panel 40, which the MEMS chip 10 and the ASIC 92 are mounted, is cut along with the divided lines 42 to be divided into the respective package-regions 41. Then, the package-panel 40 is divided into the plural package-regions 41. The MEMS package 1 and the MEMS microphone 100 are manufactured together with the package substrate 20 from each of the package-regions 41.

(Operation and Effect of the MEMS Package)

As mentioned above, the MEMS chip 10 and the ASIC 92 are mounted on the package substrate 20, and the MEMS chip 10 is connected to the ASIC 92 on the package substrate 20, in the MEMS package 1 and the MEMS microphone 100. Wires along with up and down direction, like the conventional MEMS packages 290, 310 (see FIG. 16, FIG. 17), are unnecessary, in the MEMS package 1 and the MEMS microphone 100. The electric wiring is completed within only the package substrate 20, the MEMS chip 10 and the ASIC 92, the cap 99 is not needed for forming the electric wiring. Therefore, the structures of the MEMS package 1 and the MEMS microphone 100 are simple, the MEMS package 1 and the MEMS microphone 100 are able to be manufactured certainly.

Further, the MEMS chip 10 is mounted on the package substrate 20, the top-hole 99B is formed in the cap 99, distant from the MEMS chip 10. The top-hole 99B is also able to be formed in the position, of the MEMS chip 10, distant from the hole-part 2c. Therefore, because position of the sound hole is able to be changed, generality, about the position of the sound hole, is high.

Further, because sound, which enters from the top-hole 99B, reaches the MEMS chip 10 without bending, sound never decreases before getting to the MEMS chip 10. Therefore, lowering of the sensitivity is avoided, in the MEMS package 1 and the MEMS microphone 100.

Further, in case of the MEMS package 1, the back chamber 99D is formed by the chip-cover 25. The cap 99 is mounted on the MEMS package 1, thereby, the front chamber 99A is formed to gain the MEMS microphone 100. Both the front chamber 99A and the back chamber 99D, having certain size, are secured, moreover, size balance is secured. Therefore, sensitivity of the MEMS microphone 100 is good.

The cover-supporting part 30 is manufactured by press bending with the metal plate having thin thickness. Therefore, before the MEMS package 1 and the MEMS microphone 100 are manufactured, the cover-supporting part 30 is able to be formed previously. Further, because the cover-supporting part 30 is mounted with adhesive, the MEMS package 1 and the MEMS microphone 100 are easily manufactured.

Further, the cover-supporting part 30 is able to be formed so that the supporting-height h30 is larger than the chip-height h2. Thereby, because the back chamber 99D is able to be secured largely, the cover-supporting part 30 is able to be formed with the structure according to demand characteristic.

First Modified Example

Figure 7:
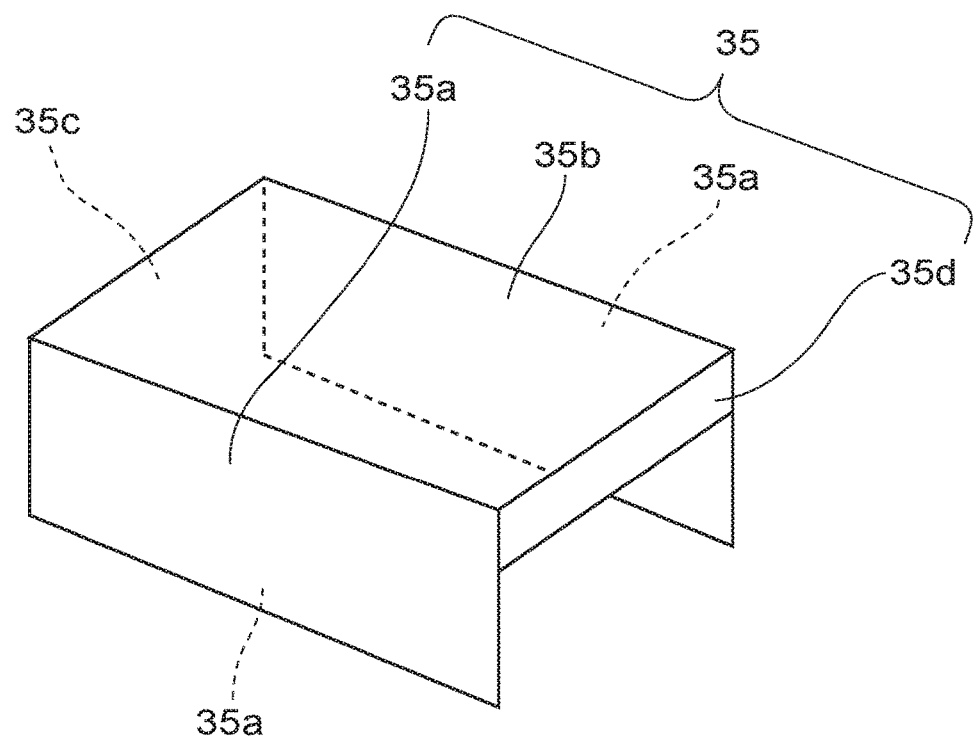
FIG. 7 is a perspective view showing the cover-supporting part according to the first modified example.

Next, the cover-supporting part 35, according to a first modified example, is explained with reference to FIG. 7. FIG. 7 is a perspective view showing the cover-supporting part 35 according to the first modified example.

The cover-supporting part 35 is the same with the supporting part 30 in that it has the open-covered-structure, in compared with the cover-supporting part 30. However, the cover-supporting part 35 is different from the cover-supporting part 30 in that it has the wall-like side-part 35a, the lid-part 35b, the opened end-part 35c and a rear-surface part 35d.

The wall-like side-part 35a is a wall-like member extended along with the intersecting direction from the package surface 20a, similar with the wall-like side-part 30a. The part, of the wall-like side-part 35a, opposing to the opened end-part 35c is the rear-surface part 35d. The rear-surface part 35d has an about half height of the wall-like side-part 35a or height smaller than the half height. Therefore, the rear-surface part 35d is partially opened.

Figure 16:
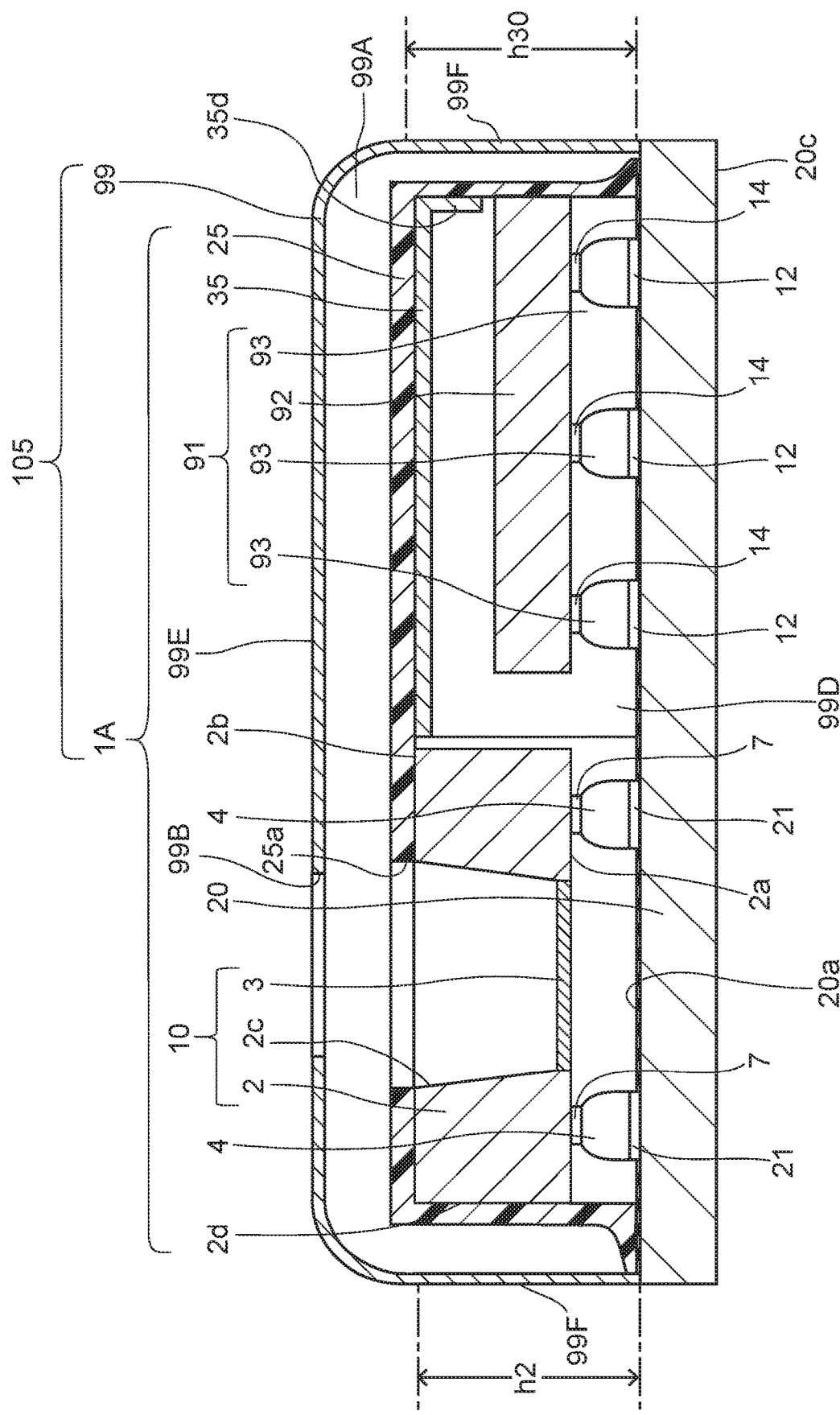
FIG. 16 is a sectional view showing the MEMS microphone having the cover-supporting part according to the first modified example, corresponding to FIG. 1.

The cover-supporting part 35 surrounds the ASIC package 91 from three directions and it is able to support the chip-cover 25, similar with the cover-supporting part 30. Therefore, the MEMS package and MEMS microphone, which the cover-supporting part 35 is formed, has the same operation and effect with the MEMS package 1 and MEMS microphone 100. Especially, in case of the MEMS package 1A and the MEMS microphone 105, which the cover-supporting part 35 is formed, as illustrated in FIG. 16, because the rear-surface part 35d is partially opened, the side surface of the ASIC 92 is able to support the chip-cover 25.

In this case, it is possible that package sizes of the MEMS package 1A and the MEMS microphone 105 are reduced.

Second Modified Example

Figure 8:
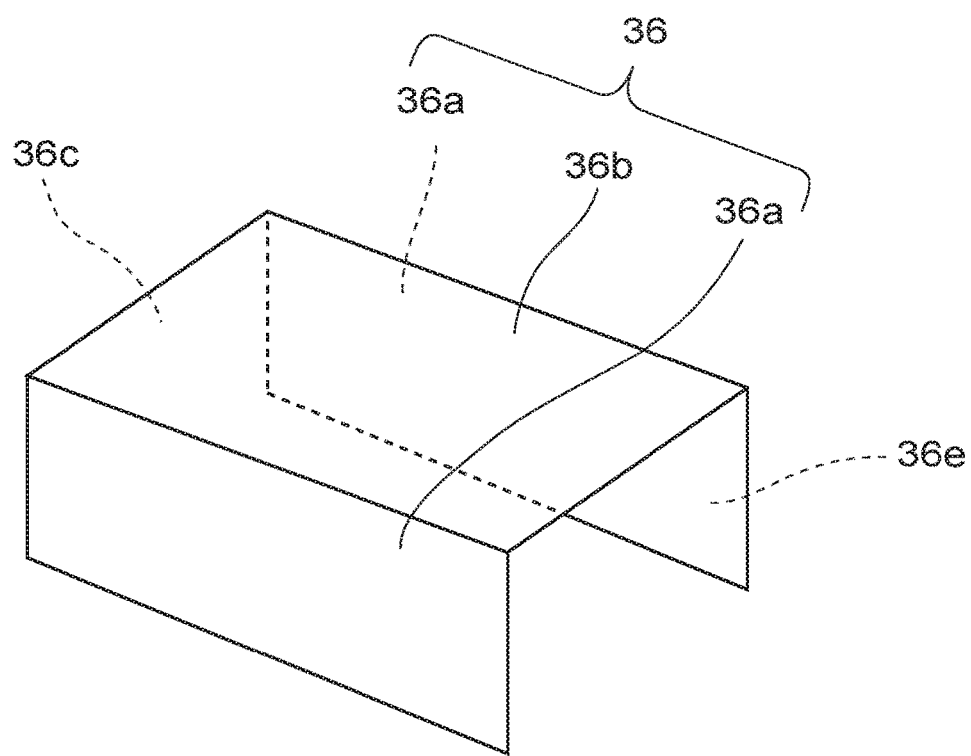
FIG. 8 is a perspective view showing the cover-supporting part according to the second modified example.

Next, the cover-supporting part 36, according to a second modified example, is explained with reference to FIG. 8. FIG. 8 is a perspective view showing the cover-supporting part 36 according to the second modified example.

The cover-supporting part 36 is the same in that it has the open-covered-structure, in compared with the cover-supporting part 35. However, the cover-supporting part 36 is different from the cover-supporting part 35 in that it has the wall-like side-part 36a, the lid-part 36b, the opened end-part 36c and the opened end-part 36e.

The wall-like side-part 36a is a wall-like member extended along with the intersecting direction from the package surface 20a, similar with the wall-like side-part 35a. However, the part, of the wall-like side-part 36a, opposing to the opened end-part 36c is the opened end-part 36e, which is entirely opened.

Figure 17:
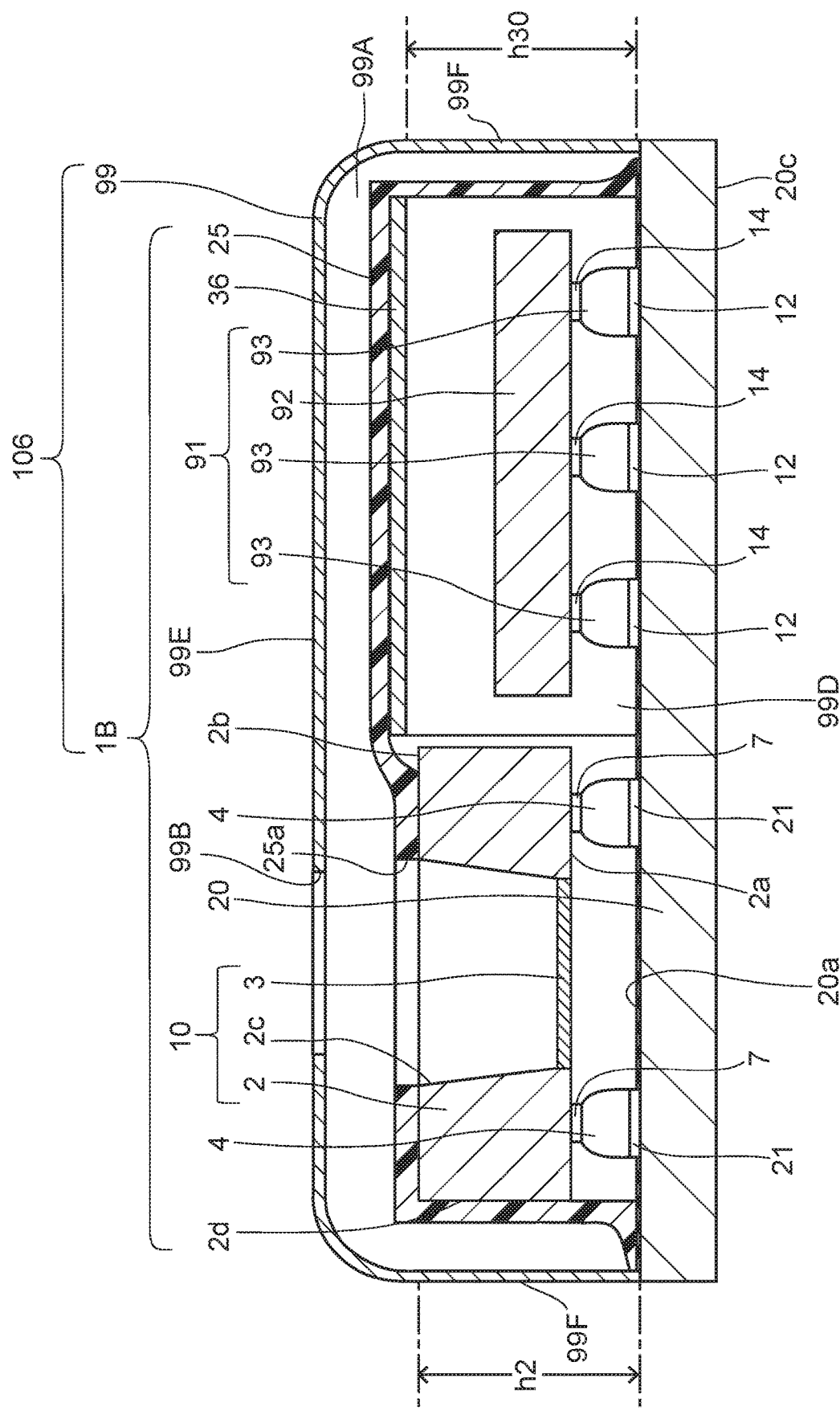
FIG. 17 is a sectional view showing the MEMS microphone having the cover-supporting part according to the second modified example, corresponding to FIG. 1.
Figure 18:
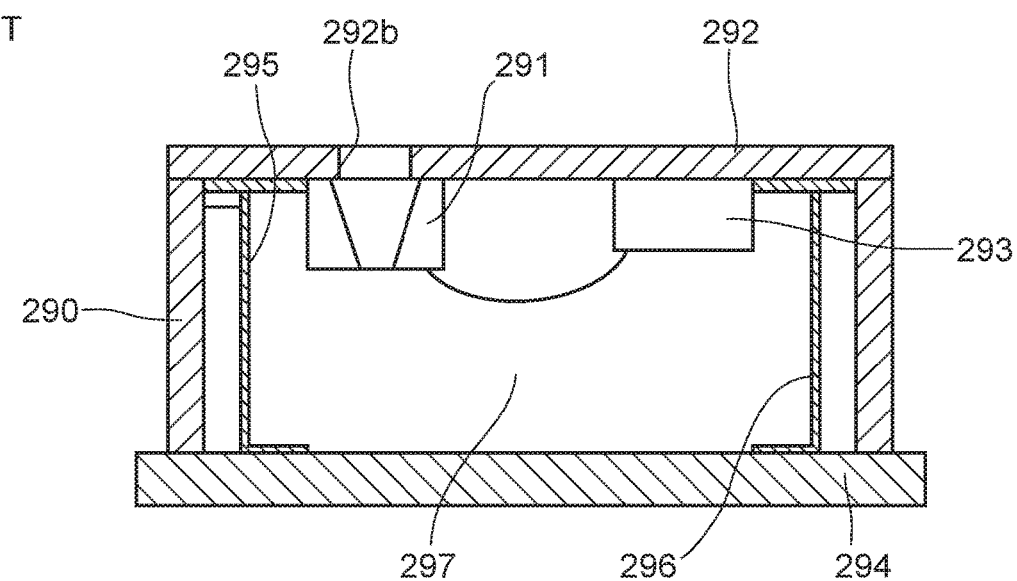
FIG. 18 is a sectional view showing the conventional MEMS microphone.
Figure 19:
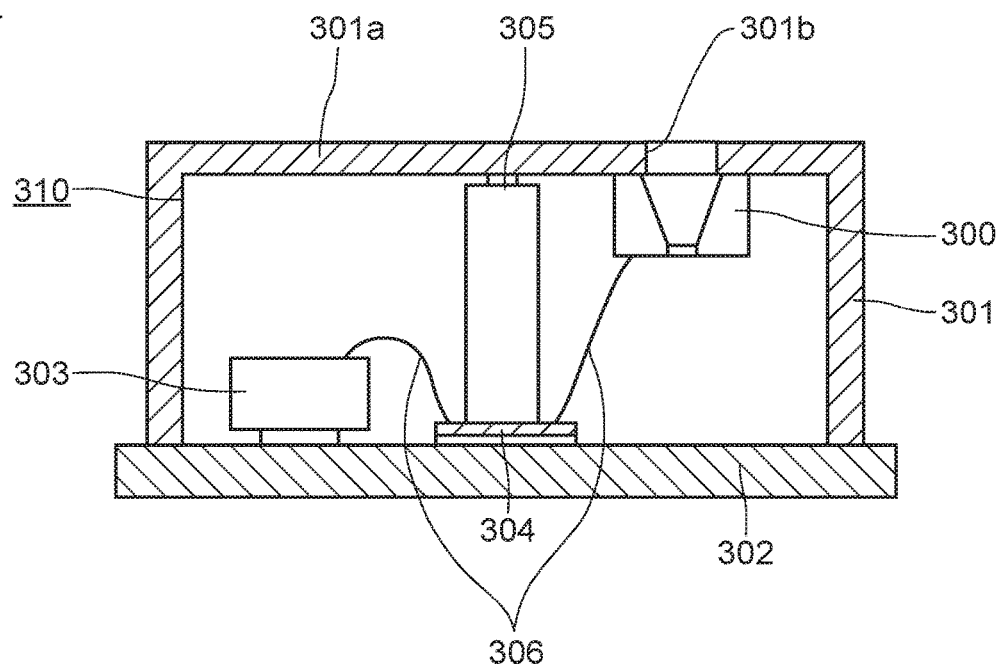
FIG. 19 is a sectional view showing another conventional MEMS microphone different from FIG. 18.
Figure 20:
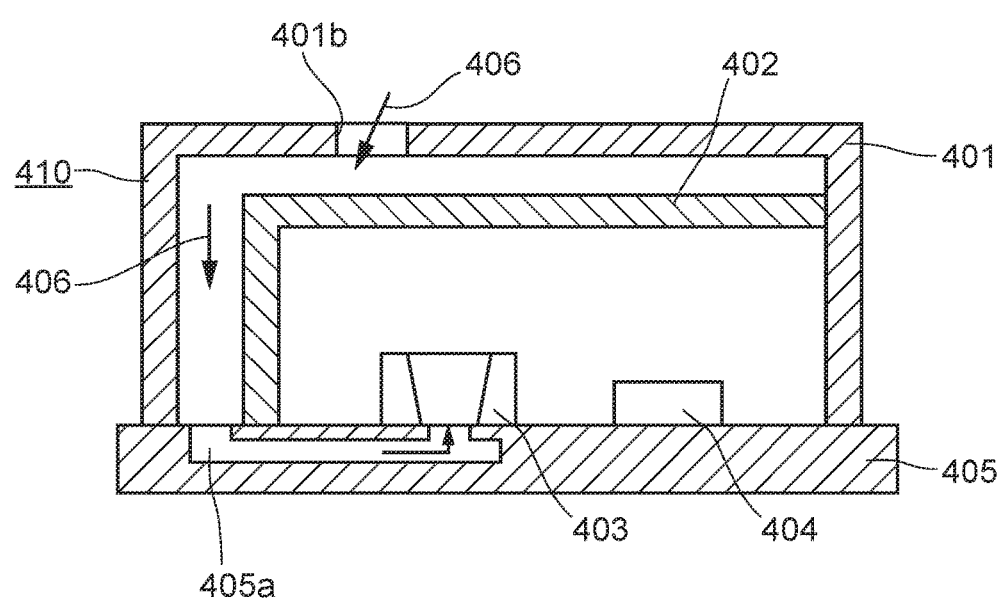
FIG. 20 is a sectional view showing another conventional MEMS microphone different from FIG. 18, FIG. 19.
Figure 21:
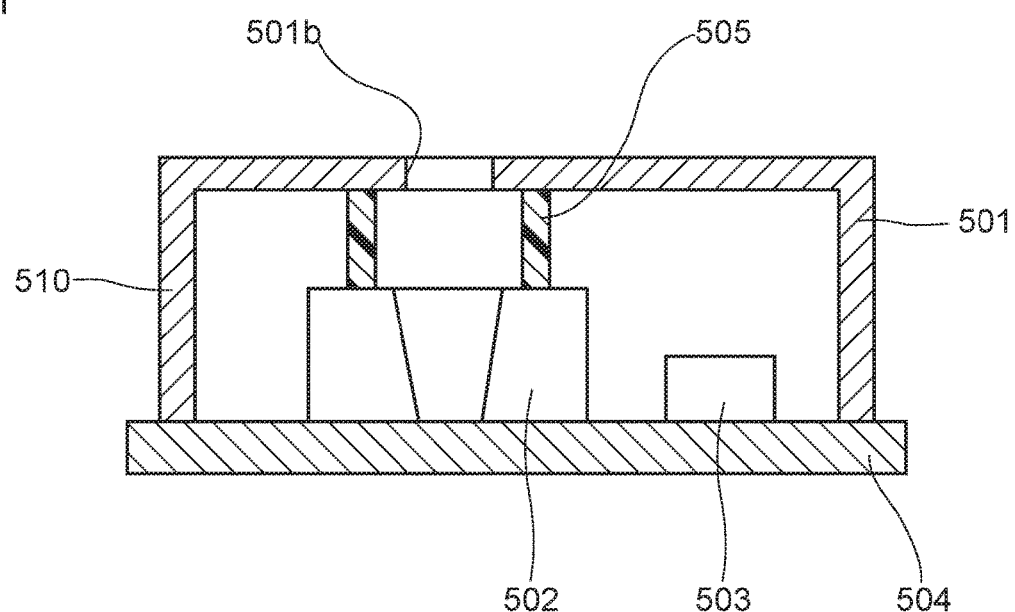
FIG. 21 is a sectional view showing another conventional MEMS microphone different from FIG. 18, FIG. 19, FIG. 20.

The cover-supporting part 36 surrounds the ASIC package 91 from two directions and it is able to support the chip-cover 25, similar with the cover-supporting part 30. Therefore, the MEMS package and MEMS microphone, which the cover-supporting part 36 is formed, has the same operation and effect with the MEMS package 1 and MEMS microphone 100. Especially, in case of the MEMS package 1B and the MEMS microphone 106, which the cover-supporting part 35 is formed, as illustrated in FIG. 17, the cover-supporting part 36 is able to support the chip-cover 25. Further, because rear side is entirely opened, the side surface of the ASIC 92 is able to support the chip-cover 25, similar with the MEMS microphone 105. In this case, it is possible that package sizes of the MEMS package 1B and the MEMS microphone 106 are reduced.

Third Modified Example

Figure 9:
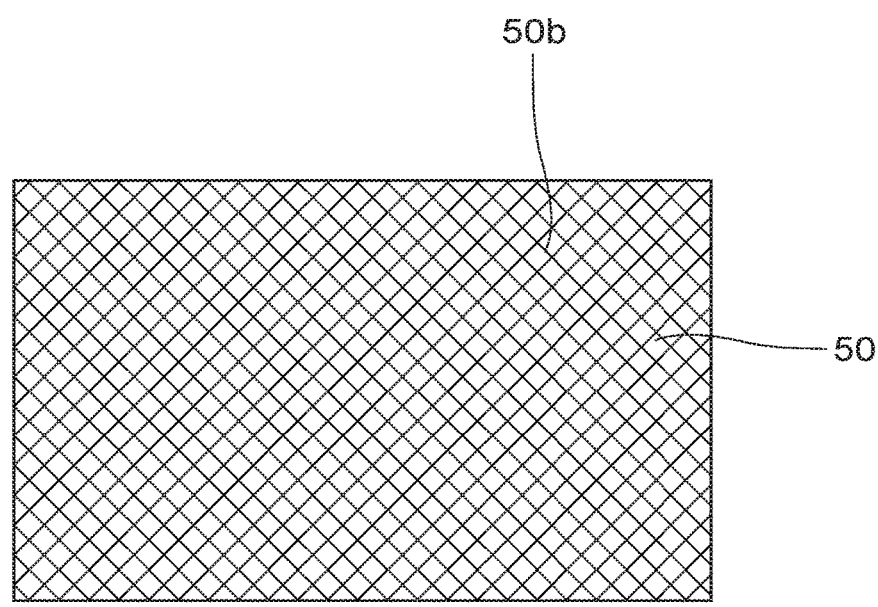
FIG. 9 is a plan view showing the cover-supporting part according to the third modified example.

Next, the cover-supporting part 50 according to the third modified example will be explained with reference to FIG. 9. Here, FIG. 9 is a plan view showing the cover-supporting part 50 according to the third modified example.

The cover-supporting part 50 is different in that it has the lid-part 50b instead of the lid-part 30b, in compare with the cover-supporting part 30. The lid-part 30b is formed with board-like shape though, the lid-part 50b has a mesh-like structure.

Because the cover-supporting part 50 has the open-covered-structure similar with the cover-supporting part 30, it surrounds the ASIC package 91 from three directions, and it is able to support the chip-cover 25. Therefore, the MEMS package and MEMS microphone, which the cover-supporting part 50 is formed, has the operation and effect similar with the MEMS package 1 and MEMS microphone 100.

Forth Modified Example

Figure 11:
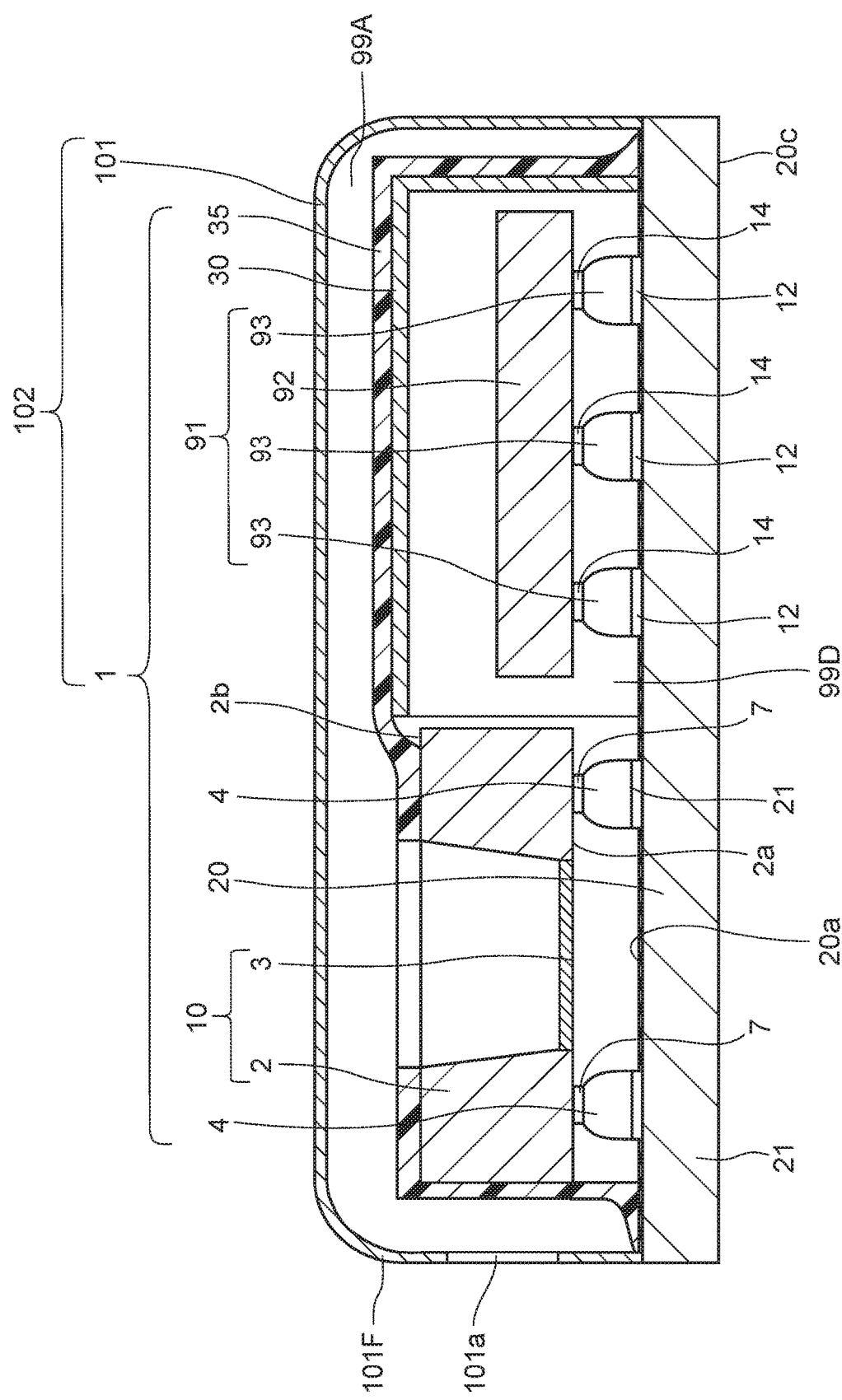
FIG. 11 is a sectional view showing the MEMS microphone according to the forth modified example, corresponding to FIG. 1.

Next, the MEMS microphone 102 according to the forth modified example will be explained with reference to FIG. 11. Here, FIG. 11 is a sectional view showing the MEMS microphone 102 according to the forth modified example, corresponding to FIG. 1.

The MEMS microphone 102 is different in that it has the cap 101 instead of the cap 99, in compare with the MEMS microphone 100.

The cap 101 is different in the position of the sound hole, in compare with the cap 99. In case of the cap 99, the top-hole 99B is formed in the top-surface 99E. However, in case of the cap 101, a side-hole 101a, as the sound hole, is formed in the cap-side-surface 101F.

In case of the above, because the front chamber 99A is formed between the cap 101 and the chip-cover 25, sensitivity of the MEMS microphone 102 is good. Because the MEMS microphone 102 has the same constitution with the MEMS microphone 100, it has the operation and effect similar with the MEMS microphone 100.

Fifth Modified Example

Figure 10:
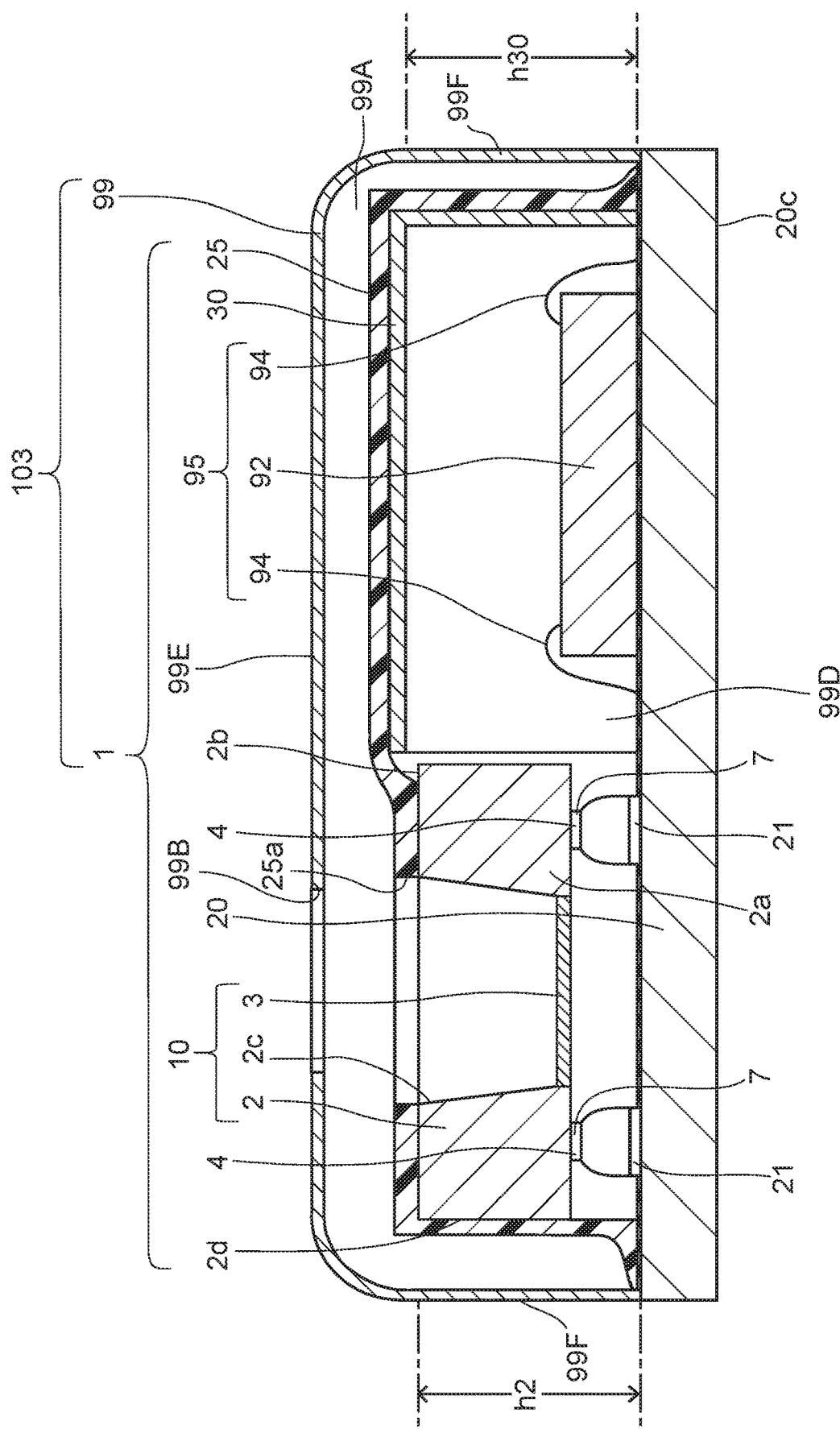
FIG. 10 is a sectional view showing the MEMS microphone according to the fifth modified example, corresponding to FIG. 1.

Next, the MEMS microphone 103 according to the fifth modified example will be explained with reference to FIG. 10. Here, FIG. 10 is a sectional view showing the MEMS microphone 103 according to the fifth modified example, corresponding to FIG. 1.

The MEMS microphone 103 is different in that it has the ASIC package 95 instead of the ASIC package 91, in compare with the MEMS microphone 100. In case of the ASIC package 95, the ASIC 92 is mounted on the package substrate 20 by the wire bonding using the wire 94.

Because the MEMS microphone 103 has the same constitution with the MEMS microphone 100, it has the operation and effect similar with the MEMS microphone 100.

The type "double back-plate", having two not illustrated thin-films which are called back-plate are arranged in the upper side and the lower side of the membrane 3, is explained exemplarily in the embodiment. The present invention is also applicable to the type "single back-plate", having one back-plate is arranged in the one side of the membrane 3.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:
1. A MEMS package comprising:
a MEMS chip, a package substrate which the MEMS chip is adhered, a chip-cover which wraps the MEMS chip and a cover-supporting part which supports the chip-cover from the inside;
wherein the chip-cover is adhered to the package substrate,
wherein the cover-supporting part is adhered to the package substrate,
wherein the chip-cover is supported by the cover-supporting part to form a back chamber, surrounded by the chip-cover and the package substrate,
wherein the chip-cover is formed so as to be directly in contact with a chip-surface, being an outer surface of the MEMS chip, without being in contact with the package substrate between the cover-supporting part and the MEMS chip.
2. The MEMS package according to claim 1, further comprising:
an ASIC package which is adhered to the package substrate in the back chamber.
3. The MEMS package according to claim 1, wherein the MEMS chip comprises an element substrate which a movable element is formed,
wherein the element substrate comprises a hole-part which the movable element is arranged,
wherein the chip-cover comprises a cover-hole-part formed in accordance with the hole-part.

4. The MEMS package according to claim 1,
wherein the MEMS chip is mounted on the package substrate by a FCB,
wherein the chip-cover is formed so as to be directly in contact with the side surface of the MEMS chip.

5. The MEMS package according to claim 1,
wherein the chip-cover comprises a slanting part, being formed so as to bridge the cover-supporting part and the MEMS chip.

6. A MEMS microphone comprising:
a MEMS package, and a cap which wraps the MEMS package,
wherein the MEMS package comprises a MEMS chip, a package substrate which the MEMS chip is adhered, a chip-cover which wraps the MEMS chip and a cover-supporting part which supports the chip-cover from the inside;
wherein the chip-cover is adhered to the package substrate,
wherein the cover-supporting part is adhered to the package substrate,
wherein the chip-cover is supported by the cover-supporting part to form a back chamber, surrounded by the chip-cover and the package substrate.

7. The MEMS microphone according to claim 6,
wherein the cap comprises a top-surface, which is formed so as to oppose to the package substrate, and a cap-side-surface, which surrounds the top-surface and adhered to the package substrate,
wherein the MEMS microphone further comprising a front chamber which is formed between the top-surface, the cap-side-surface and the chip-cover.

8. The MEMS microphone according to claim 7,
wherein the MEMS chip comprises an element substrate which a movable element is formed,
wherein the element substrate comprises a hole-part which the movable element is arranged,
wherein the chip-cover comprises a cover-hole-part formed in accordance with the hole-part.

9. The MEMS microphone according to claim 8,
wherein the top-surface comprises a top-hole which is formed in the position in accordance with the cover-hole-part.

10. The MEMS microphone according to claim 7,
wherein the cap-side-surface comprises a side-hole which is formed in the position in accordance with the side surface of the MEMS chip.

11. The MEMS microphone according to claim 6, further comprising:
an ASIC package which is adhered to the package substrate in the back chamber.

12. A MEMS package comprising:
a MEMS chip, a package substrate which the MEMS chip is adhered, a chip-cover which wraps the MEMS chip and a cover-supporting part which supports the chip-cover from the inside;
wherein the chip-cover is adhered to the package substrate,
wherein the cover-supporting part is adhered to the package substrate,
wherein the chip-cover is supported by the cover-supporting part to form a back chamber, surrounded by the chip-cover and the package substrate,
wherein the MEMS package further comprises an ASIC package which is adhered to the package substrate in the back chamber,
wherein the cover-supporting part comprises an open-covered-structure which includes a wall-like side-part and a lid-part,
wherein the wall-like side-part extends along with a surface intersecting direction of the package substrate, and the MEMS chip side is opened,
wherein the lid-part is formed in an upper end part of the wall-like side-part,
wherein the ASIC package is arranged under the lid-part.

* * * * *